(12) United States Patent
Cho et al.

(10) Patent No.: US 8,927,996 B2
(45) Date of Patent: Jan. 6, 2015

(54) OLED DISPLAY DEVICE THAT PREVENTS SHORTING OF INTERCONNECTIONS DURING MANUFACTURE THEREOF

(75) Inventors: Seung-Yeon Cho, Yongin (KR); Zail Lhee, Yongin (KR); Tae-Wook Kang, Yongin (KR); Hun Kim, Yongin (KR); Mi-Sook Suh, Yongin (KR); Hyun-Chol Bang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 249 days.

(21) Appl. No.: 12/954,804

(22) Filed: Nov. 26, 2010

(65) Prior Publication Data

US 2011/0127538 A1 Jun. 2, 2011

(30) Foreign Application Priority Data

Nov. 30, 2009 (KR) ........................ 10-2009-0116423

(51) Int. Cl.
*H01L 23/48* (2006.01)
*H01L 27/32* (2006.01)
*H01L 51/52* (2006.01)

(52) U.S. Cl.
CPC ........ *H01L 27/3276* (2013.01); *H01L 51/5246* (2013.01)
USPC ........ 257/72; 257/88; 257/698; 257/E23.193; 257/E33.062; 257/E33.066; 257/688; 257/689

(58) Field of Classification Search
USPC .............. 257/72, 88, 688, 689, 698, E23.193, 257/E33.062, E33.066
See application file for complete search history.

(56) References Cited

U.S. PATENT DOCUMENTS

| | | | |
|---|---|---|---|
| 6,656,829 B2 | 12/2003 | Miyamoto | |
| 6,798,132 B2 * | 9/2004 | Satake | 313/495 |
| 2003/0089991 A1 * | 5/2003 | Yamazaki et al. | 257/759 |
| 2006/0060852 A1 * | 3/2006 | Yamazaki et al. | 257/59 |
| 2006/0076887 A1 * | 4/2006 | Kang | 313/512 |

FOREIGN PATENT DOCUMENTS

| | | |
|---|---|---|
| JP | 2007273409 A | 10/2007 |
| KR | 1020030074190 A | 9/2003 |
| KR | 100685841 B1 | 2/2007 |
| KR | 100712185 B1 | 4/2007 |
| KR | 1020070050763 A | 5/2007 |

* cited by examiner

*Primary Examiner* — Robert Huber
(74) *Attorney, Agent, or Firm* — Robert E. Bushnell, Esq.

(57) ABSTRACT

An organic light emitting diode (OLED) display device, including a first substrate and a second substrate facing each other, a sealant arranged between the first and second substrates to adhere the first and second substrates together, a plurality of interconnections arranged on one of the first and second substrates and a plurality of cladding parts covering at least a portion of each of the plurality of interconnections at a location that corresponds to the sealant, each of the cladding parts including a material having a higher melting point than that of the interconnections. By including the cladding parts, a short circuit between the interconnections caused by heat applied to the sealant can be prevented, and safety and reliability of the OLED display device can be improved.

6 Claims, 4 Drawing Sheets

OLED DISPLAY DEVICE THAT PREVENTS SHORTING OF INTERCONNECTIONS DURING MANUFACTURE THEREOF

CLAIM OF PRIORITY

This application makes reference to, incorporates the same herein, and claims all benefits accruing under 35 U.S.C. §119 from an application earlier filed in the Korean Intellectual Property Office on 30 Nov. 2009 and there duly assigned Serial No. 10-2009-0116423.

BACKGROUND OF THE INVENTION

1. Field of the Invention

Aspects of the present invention relate to a design for an organic light emitting diode (OLED) display device that can prevent a short circuit between interconnections at a location that corresponds to a sealant upon heat being applied to cure the sealant.

2. Description of the Related Art

Among flat panel display devices, an OLED display device is a self-emissive device which emits light when excitons generated by combining electrons from an electron injection electrode (cathode) and holes from a hole injection electrode (anode), which are injected into an emitting layer, transition from an excited state to a ground state.

Accordingly, compared to a conventional thin film liquid crystal display device, the OLED display device does not need a separate light source, and can have a smaller volume and be lighter in weight.

Generally, the OLED display device is fabricated by forming an organic light emitting diode including a first electrode, a second electrode, and an organic emitting layer arranged between the first and second electrodes on a first substrate, and adhering the first substrate to a second substrate opposite to the first substrate using a sealant to protect the organic light emitting diode from external impurities and moisture.

In addition, the OLED display device may further include a thin film transistor to control emission of the organic light emitting diode, and thus many external interconnections are included to supply signals to the organic light emitting diode and the thin film transistor from an external source.

After the sealant is applied to the first or second substrate, these substrates are combined with the sealant arranged therebetween, and the sealant is plasticized through thermal treatment to adhere the first substrate to the second substrate.

Here, in the portion where the sealant is applied, there are interconnections extending there through connecting an external controller to the thin film transistor and the organic light emitting diode. Thus, a part of the interconnection corresponding to the sealant may expand or melt due to the heat applied to cure the sealant, thereby causing a short-circuit of one interconnection with an adjacent interconnection.

SUMMARY OF THE INVENTION

Aspects of the present invention provide an OLED display device which can prevent a short circuit between interconnections at a location corresponding to a sealant and due to heat applied to the sealant.

According to an aspect of the present invention, there is provided an OLED display device that includes a first substrate and a second substrate facing each other, a sealant arranged between the first and second substrates to adhere the first and second substrates together, a plurality of interconnections arranged on one of the first and second substrates and a plurality of cladding parts covering at least a portion of each of the plurality of interconnections at a location that corresponds to the sealant, each of the cladding parts including a material having a higher melting point than that of the interconnections.

Each of the cladding parts may completely cover a corresponding one of the interconnections at the location that corresponds to the sealant. Each cladding part may cover sides and only a portion of a top surface of a corresponding one of said interconnections at the location that corresponds to the sealant. Each of the cladding parts may be comprised of a material selected from a group consisting of a metallic material, an organic material and an inorganic material.

The OLED display device may further include an emission region and a non-emission region arranged between the first and second substrates, the plurality of interconnections being arranged in the non-emission region and extending from signal lines arranged in the emission region. The OLED display device may further include a gate insulating layer, a gate electrode, an interlayer insulating layer, first and second source/drain electrodes, a protection layer, a planarization layer, and first and second pixel electrodes arranged on the first substrate.

The OLED display device may further include an emission region and a non-emission region arranged between the first and second substrates, the plurality of interconnections being arranged in the non-emission region and extending from one of the gate electrode, the first and second source/drain electrodes, and the first and second pixel electrodes arranged in the emission region. The plurality of cladding parts may be comprised of substantially a same material as at least one of the interlayer insulating layer, the first and second source/drain electrodes, the protection layer, the planarization layer and the first and second pixel electrodes.

According to another aspect of the present invention, there is provided an OLED display device that includes first and second substrates facing each other, an emission region arranged between the first substrate and the second substrate, the emission region including a plurality of signal lines, a sealant arranged along an edge of the emission region to adhere the first and second substrates together, a non-emission region arranged outside the sealant, a plurality of interconnections extending from the signal lines in the emission region through the sealant and into the non-emission region and a plurality of cladding parts covering at least a portion of each of the plurality of interconnections at a location corresponding to where the interconnections extend through the sealant, the cladding parts including a material having a higher melting point than that of the interconnections.

Each of said cladding parts may completely cover a corresponding one of said interconnections at a location corresponding to where the one of said interconnections extends through the sealant. Each of said cladding parts may instead cover sides and only a portion of a top surface of a corresponding one of said interconnections at a location corresponding to where the one of said interconnections extends through the sealant. Each of said plurality of cladding parts may be comprised of a material selected from a group consisting of a metallic material, an organic material and an inorganic material.

The OLED display device may further include a gate insulating layer, a gate electrode, an interlayer insulating layer, a first source/drain electrode, a second source/drain electrode, a protection layer, a planarization layer, a first pixel electrode and a second pixel electrode arranged on the first substrate. The signal lines from which the interconnections extend from may be selected from a group consisting of the gate electrode, the first source/drain electrode, the second source/drain electrode the first pixel electrode and the second pixel electrode. The cladding parts may be comprised of a same material as at least one of the interlayer insulating layer, the first source/drain electrode, the second source/drain electrode, the protection layer, the planarization layer, the first pixel electrode and the second pixel electrode.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
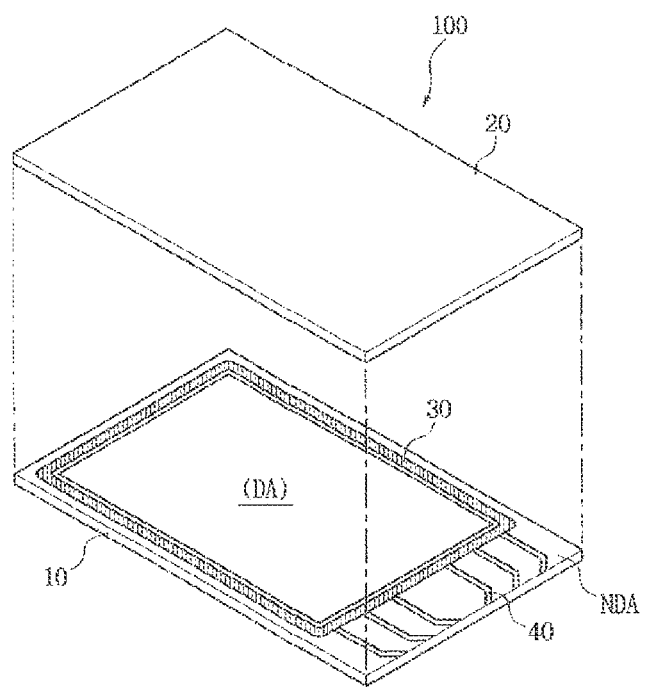
FIG. 1 is an exploded perspective view of an OLED display device according to an exemplary embodiment of the present invention.

The present invention will now be described more fully hereinafter with reference to the accompanying drawings, in which exemplary embodiments of the invention are shown. Like numerals denote like elements throughout the specification, and when one part is "connected to another part", these parts may be "directly connected" to each other, or "electrically connected" to each other having a third device therebetween. Moreover, in the drawings, thicknesses of layers and regions are exaggerated for clarity.

Figure 2:
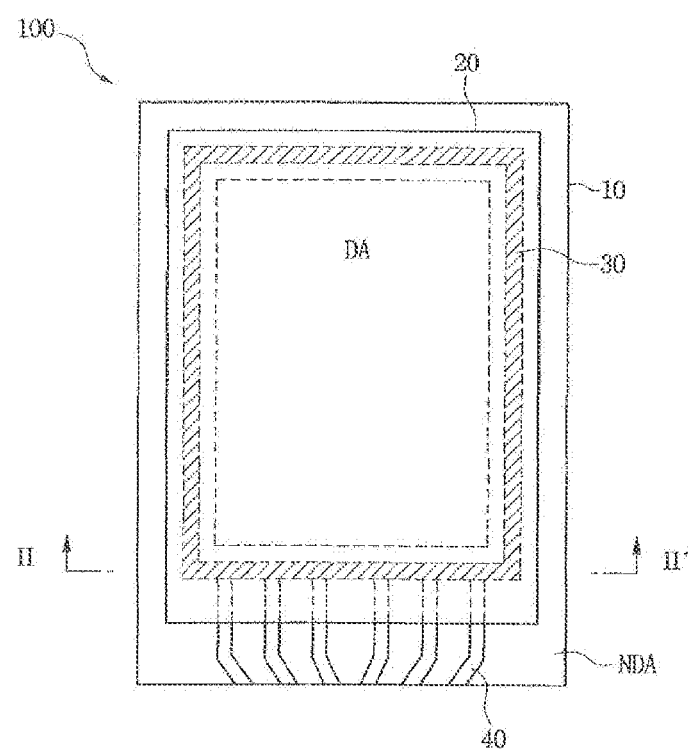
FIG. 2 is an assembled plan view of an OLED display device according to an exemplary embodiment of the present invention.
Figure 3:
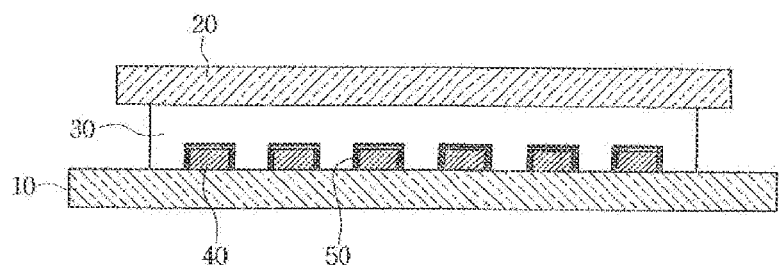
FIG. 3 is a cross-sectional view taken along line II-II' of FIG. 2 according to one embodiment of the present invention.
Figure 4:
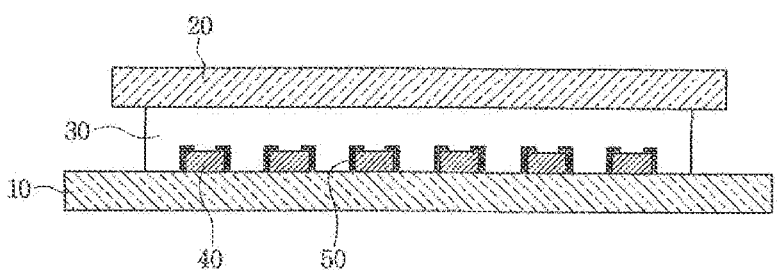
FIG. 4 is a cross-sectional view taken along line II-II' of FIG. 2 according to another embodiment of the present invention.
Figure 5:
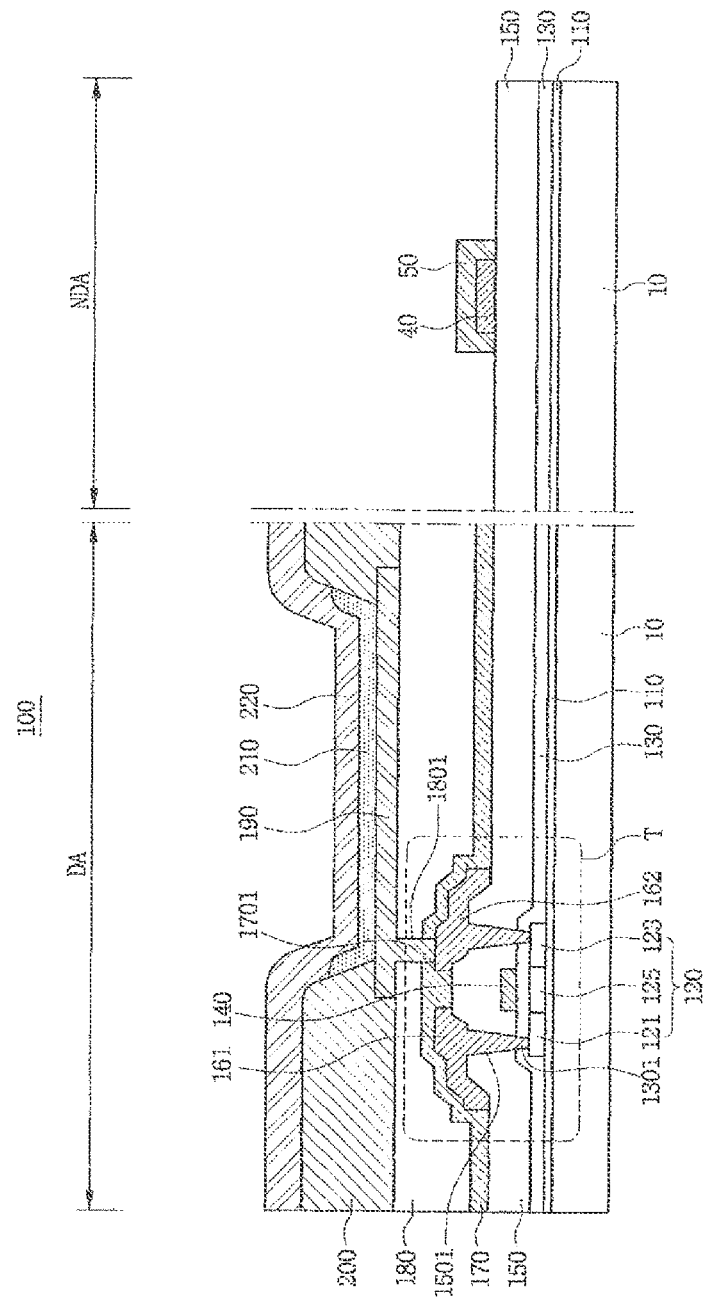
FIG. 5 is an enlarged view illustrating an emission region and a non-emission region of FIG. 1.

FIG. 1 is an exploded perspective view of an OLED display device according to an exemplary embodiment of the present invention, FIG. 2 is an assembled plan view of an OLED display device according to an exemplary embodiment of the present invention, FIG. 3 is a cross-sectional view taken along line II-Ii' of FIG. 2 according to one embodiment of the present invention, FIG. 4 is a cross-sectional view taken along line II-II' of FIG. 2 according to another embodiment of the present invention, and FIG. 5 is an enlarged view illustrating an emission region and a non-emission region of the OLED display device of FIG. 1.

Referring to FIGS. 1 and 2, an OLED display device 100 according to an exemplary embodiment of the present invention includes first and second substrates 10 and 20 facing each other and a sealant 30 interposed between the first and second substrates 10 and 20 to adhere the first and second substrates 10 and 20 together.

The first and second substrates 10 and 20 may be made out of an insulating material or a metallic material, may be transparent or non-transparent, and may include glass, plastic or stainless steel. However, the both substrates can not be made out of a non-transparent material because an image needs to transmit through one of the first and second substrates 10 and 20 to be viewed.

An emission region DA is formed between the first and second substrates 10 and 20. The sealant 30 is applied along an edge of the emission region DA to seal together first and second substrates 10 and 20 so that the emission region DA is protected from impurities or moisture.

The emission region DA, for example, includes a plurality of organic light emitting diodes between the first and second substrates 10 and 20, and further includes a plurality of thin film transistors (not shown) between the first and second substrates 10 and 20 to control the organic light emitting diodes.

The emission region DA and the sealant 30 may be arranged on the first or second substrate 10 or 20, and in the exemplary embodiment, the emission region DA and the sealant 30 are arranged on the first substrate 10 that is adhered to the second substrate 20.

The OLED display device 100 includes a non-transparent region NDA arranged outside the sealant 30. In the non-transparent region NDA, interconnections 40 are arranged that extend from signal lines arranged within the emission region DA. These signal lines within the emission region DA from which the interconnections 40 extend can be data lines, scan lines or power voltage lines. These interconnections 40 are electrically connected to a driving integrated circuit (not shown) or flexible circuit board (not shown) and serve to transmit signals to the signal lines.

In the exemplary embodiment, the interconnections 40 are arranged on the first substrate 10, but may instead be arranged on the second substrate 20.

The sealant 30 may be arranged on the interconnections 40. According to the location of the sealant 30, the interconnections 40 may extend into the non-transparent region NDA through the sealant 30 from the emission region. DA.

Here, the OLED display device 100 according to the present invention further includes cladding parts 50 covering the interconnections 40 at locations that correspond to the sealant 30. The cladding parts 50 serve to prevent short circuiting between neighboring interconnections 40 upon the plasticization of the sealant when heat is applied to the sealant. Thus, the cladding parts 50 should be made out of a material having a higher melting point than that of the interconnections 40, for example a metallic, inorganic or organic material. The cladding parts 50 may be made out of a material that is substantially identical to that of one of the layers in the emission region DA, or can instead be made out of a different material.

Here, as shown in FIG. 3, the cladding parts 50 may be formed to completely cover the interconnections 40, or as shown in FIG. 4, may be formed to cover sides and only a portion of a top surface of the interconnections 40. If the cladding parts 50 are formed to cover only the sides of the interconnections 40, molten interconnections may pass the cladding parts 50 and form a short with an adjacent interconnection. Thus, the cladding parts 50 preferably cover top surfaces of the interconnections 40 as well as the sides thereof.

Even if the interconnections 40 melt or expand, the cladding parts 50 are not transformed. For this reason, the interconnections 40 can still be arranged in the cladding parts 50, thereby preventing a short circuit between the interconnections 40.

Hereinafter, referring to FIG. 5, an exemplary embodiment for forming a cladding part 50 simultaneously and of a same material as a layer in the emission region DA will now be described.

A buffer layer 110 is formed on a first substrate 10 that includes an emission region DA and a non-emission region NDA. The buffer layer 110 prevents out-diffusion of impurities from a first substrate 10 during formation of a semiconductor layer 120. The buffer layer 110 may be made out of a silicon nitride layer, or a combination layer of silicon nitride and silicon oxide.

A semiconductor layer 120 is formed in the emission region DA and on the buffer layer 110. Here, the semiconductor layer 120 includes a first source/drain region 121, a second source/drain region 123 and a channel region 125 connecting the first and second source/drain regions 121 and 123 together. When the first source/drain region 121 is a source region, the second source/drain region 123 may be a drain region, and when the first source/drain region 121 is a drain region, the second source/drain region 123 may be a source region.

A gate insulating layer 130 is formed on the semiconductor layer 120 and on the buffer layer 110 in the emission region DA and on the buffer layer 110 in the non-emission region NDA. First contact holes 1301 are formed in the gate insulating layer 130 to correspond to the first and second source/drain regions 121 and 123.

In the emission region DA on the gate insulating layer 130, a gate electrode 140 is formed to correspond to the semiconductor layer 120. Here, the gate electrode 140 may be made out of a metal such as molybdenum (Mo), tungsten (W), titanium (Ti), aluminum (Al), chromium (Cr), or an alloy thereof.

An interlayer insulating layer 150 is formed on the gate electrode 140 and on gate insulating layer 130 in the emission region DA and on the insulating layer 130 in the non-emission region NDA. Second contact holes 1501 are formed in the interlayer insulating layer 150 at locations that correspond to the first contact holes 1301.

A first source/drain electrode 161 and a second source/drain electrode 162 are formed on the interlayer insulating layer 150 in the emission region DA, and electrically connect to the first and second source/drain regions 121 and 123 of semiconductor layer 120 exposed through the first and second contact holes 1301 and 1501. The first and second source/drain electrodes 161 and 162 may be made out of a metal such as molybdenum (Mo), tungsten (W), titanium (Ti), aluminum (Al) or an alloy thereof. As a result, a thin film transistor T including the semiconductor layer 120, the gate electrode 140 and the first and second source and drain electrodes 161 and 162 is formed.

In the OLED display device 100 of FIG. 5, an interconnection 40 is formed in the non-emission region NDA and is connected to first or second source/drain electrodes 161 or 162 in the emission region DA.

A protection layer 170 is formed on the first and second source/drain electrodes 161 and 162 and on the interlayer insulating layer 150 in the emission region DA. Next, a first via hole 1701 exposing one of the first and second source/drain electrodes 161 and 162 is formed in the protection layer 170.

A planarization layer 180 is formed on the protection layer 170, and a second via hole 1801 is formed in the protection layer 170 at a location that corresponds to the first via hole 1701, exposing one of the first and second source/drain electrodes 161 and 162 through the first and second via holes 1701 and 1801.

A first pixel electrode 190 is formed on the planarization layer 180 by patterning. First pixel electrode 190 is electrically connected to one of the first and second source and drain electrodes 161 and 162 through the first and second via holes 1701 and 1801.

Here, a cladding part 50 is made out of the same material as the first pixel electrode 190 to cover the interconnection 40 arranged in the non-emission region NDA. The cladding part 50 may be formed by covering the interconnection 40 with a material used to produce the first pixel electrode 190, and etching a part of the covered region. Alternatively, the cladding part 50 may be made out of a different material from that of the first pixel electrode 190 to cover the interconnection 40.

A pixel defining layer 200 electrically separating adjacent first pixel electrodes 190 from each other is formed to expose a portion of the first pixel electrode 190.

An organic emitting layer 210 is formed on the first pixel electrode 190 exposed by the pixel defining layer 200, and a second pixel electrode 220 is formed on the pixel defining layer 200 and on the organic emitting layer 210, the second pixel electrode covering an entire surface of the emission region DA. Afterwards, a sealant 30 is arranged on the cladding part 50 covering the interconnection 40 to adhere the first substrate 10 to the second substrate 20.

In the exemplary embodiment of FIG. 5, the interconnection 40 electrically connected to the first or second source/drain electrode 161 or 162 and extending into the non-emission region NDA is covered by cladding part 50 made out of the same material as the first pixel electrode 190, however the present invention is in no way so limited thereto. The interconnection 40 may instead be electrically connected to the gate electrode 140, first pixel electrode 190 or the second pixel electrode 220 and still be within the scope of the present invention.

Further, the material for the cladding part 50 covering the interconnection 40 may instead be made out of the same material as the protection layer 170, the planarization layer 180 or the second pixel electrode 220 and still be within the scope of the present invention.

Preferably, the cladding part 50 may be formed using a material having a higher melting point than that of the interconnection 40. Cladding part 50 may also be formed simultaneously and of substantially a same material as a layer formed after the formation of the interconnection 40.

According to the present invention, a short circuit between interconnections in the vicinity of the sealant caused by heat applied to cure the sealant can be prevented, and thus safety and reliability of the OLED display device can be improved.

Although the present invention has been described with reference to predetermined exemplary embodiments thereof, it will be understood by those skilled in the art that a variety of modifications and variations may be made to the present invention without departing from the spirit or scope of the present invention defined in the appended claims and their equivalents.

What is claimed is:

1. An organic light emitting diode (OLED) display device, comprising:
   first and second substrates facing each other;
   an emission region (DA) arranged between the first substrate and the second substrate, the emission region corresponding to a plurality of organic light emitting diodes and including a plurality of signal lines;
   a sealant surrounding the emission region to adhere the first and second substrates together, the sealant having four sides and four corners connecting the sides together;
   a non-emission region (NDA) arranged external to the emission region (DA) and being absent of any organic light emitting diodes;
   a plurality of interconnections arranged in parallel to each other, in close proximity to one another and extending from the signal lines in the emission region, through only one of the four sides of the sealant and into the non-emission region, each of the interconnections having a top surface and two opposing side surfaces, each of the interconnections intersect the sealant at a same side of the emission region (DA);
a plurality of cladding parts covering an entirety of both side surfaces and at least a portion of the top surface of each of the plurality of interconnections at a location corresponding to where the interconnections extend through the sealant, the cladding parts including a material having a higher melting point than that of the interconnections; and
a gate insulating layer, a gate electrode, an interlayer insulating layer, a first source/drain electrode, a second source/drain electrode, a protection layer, a planarization layer, a first pixel electrode and a second pixel electrode arranged on the first substrate, wherein the cladding parts being comprised of a material having a same composition as the first pixel electrode.

2. The OLED display device of claim 1, wherein each of the cladding parts completely covers the top surface of each of the plurality of interconnections at a location corresponding to where the one of said interconnections extends through the sealant.

3. The OLED display device of claim 1, wherein the signal lines from which the interconnections extend from are selected from a group consisting of the gate electrode, the first source/drain electrode and the second source/drain electrode.

4. The OLED display device of claim 1, wherein the cladding parts are comprised of a same composition as at least one of the interlayer insulating layer, the first source/drain electrode, the second source/drain electrode, the protection layer, the planarization layer, the first pixel electrode and the second pixel electrode.

5. The OLED display device of claim 1, the cladding parts to prevent an electrical short between adjacent ones of the interconnections due to melting of the interconnections during an application of heat during a curing process of the sealant.

6. The OLED display device of claim 1, wherein the plurality of interconnections include at least six interconnections extending in parallel to each other and being arranged in a vicinity of each other, wherein each of the interconnections extend in a direction that is orthogonal to a longitudinal direction of a portion of the sealant that the interconnections extend through.

* * * * *